United States Patent
Lee et al.

(10) Patent No.: US 9,883,604 B2
(45) Date of Patent: Jan. 30, 2018

(54) DISPLAY DEVICE AND CONTROLLING METHOD THEREOF

(71) Applicant: Samsung Display Co., Ltd., Yongin-si, Gyeonggi-do (KR)

(72) Inventors: Jun Heui Lee, Seoul (KR); Seong Gyu Kwon, Suwon-si (KR); Jae Cheol Park, Hwaseong-si (KR); Gyeong Eun Eoh, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/185,705

(22) Filed: Jun. 17, 2016

(65) Prior Publication Data

US 2017/0181304 A1 Jun. 22, 2017

(30) Foreign Application Priority Data

Dec. 17, 2015 (KR) ........................ 10-2015-0180849

(51) Int. Cl.
| | | |
|---|---|---|
| *H05K 7/00* | (2006.01) | |
| *H01L 51/00* | (2006.01) | |
| *G02F 1/1333* | (2006.01) | |
| *G09F 9/30* | (2006.01) | |
| *G06F 1/16* | (2006.01) | |

(52) U.S. Cl.
CPC ....... *H05K 7/005* (2013.01); *G02F 1/133305* (2013.01); *G02F 1/133377* (2013.01); *H01L 51/0097* (2013.01); *G06F 1/1652* (2013.01); *G09F 9/301* (2013.01)

(58) Field of Classification Search
CPC .............. H05K 7/005; G02F 1/133377; G02F 1/133305; H01L 51/0097; G06F 1/1652; G09F 9/301; G09G 2380/02
See application file for complete search history.

(56) References Cited

U.S. PATENT DOCUMENTS

2008/0086925 A1* 4/2008 Yang ................... H04M 1/0268
40/610
2010/0265668 A1* 10/2010 Yuen ........................ G09F 7/04
361/736

(Continued)

FOREIGN PATENT DOCUMENTS

KR   10-2009-0014772    2/2000
KR   10-0781708         12/2007

(Continued)

*Primary Examiner* — Dimary Lopez Cruz
*Assistant Examiner* — Abhishek Rathod
(74) *Attorney, Agent, or Firm* — Innovation Counsel LLP

(57) ABSTRACT

A display device may include a display panel, and first member, and a second member. The display panel has a first section and a second section. The first member includes an electromagnet, extends parallel to the first section and has a first side and a second side. The first side is oriented a first obtuse angle with respect to the second side. The second member directly contacts the first member, extends parallel to the second section, and has a third side and a fourth side. The third side is oriented a second obtuse angle with respect to the fourth side. The first member is connected through the second member to the second section. The second member is connected through the first member to the first section.

16 Claims, 32 Drawing Sheets

(56) References Cited

U.S. PATENT DOCUMENTS

| | | | | |
|---|---|---|---|---|
| 2013/0114193 A1* | 5/2013 | Joo | ............... | F16M 11/08 |
| | | | | 361/679.01 |
| 2014/0049464 A1* | 2/2014 | Kwak | ............... | G06F 3/0487 |
| | | | | 345/156 |
| 2014/0321073 A1* | 10/2014 | Hong | ............... | G06F 1/1652 |
| | | | | 361/749 |
| 2015/0047796 A1* | 2/2015 | Peng | ............... | E06B 9/42 |
| | | | | 160/323.1 |
| 2016/0231843 A1* | 8/2016 | Kim | ............... | G06F 3/0412 |
| 2016/0270208 A1* | 9/2016 | Bostick | ............... | H05K 5/0217 |

FOREIGN PATENT DOCUMENTS

| | | |
|---|---|---|
| KR | 10-2012-0026880 | 3/2012 |
| KR | 10-2013-0050794 | 5/2013 |
| KR | 10-2014-0127620 | 11/2014 |

\* cited by examiner

DISPLAY DEVICE AND CONTROLLING METHOD THEREOF

RELATED APPLICATION(S)

This application claims priority to and the benefit of Korean Patent Application No. 10-2015-0180849 filed in the Korean Intellectual Property Office on Dec. 17, 2015; the entire contents of the Korean Patent Application are incorporated herein by reference.

BACKGROUND

1. Field

The technical field relates to a display device and a controlling (and/or operating) method of the display device.

2. Description of the Related Art

In order to improve portability of display devices, rollable and/or bendable display devices have been developed. For example, a liquid crystal display may include a substrate that is formed of an easily bendable material, such as plastic.

However, because of rigidity of the substrate and/or other reasons, it is typically difficult to roll or bend a rollable or bendable display device. It is also typically difficult to maintain a rollable or bendable display device in a rolled or bent state due to resilience of the substrate and/or other reasons.

The Background section is to enhance understanding of the background of this application. The Background may contain information that does not form the prior art that is already known in this country to a person of ordinary skill in the art.

SUMMARY

An embodiment may be related to a display device that include the following elements: a display panel; and a flexibility adjuster that includes a plurality of electromagnets positioned on an edge of the display panel, wherein the plurality of electromagnets may include a first electromagnet and a second electromagnet contacting each other, and an angle formed by the first electromagnet and the second electromagnet may vary according to a position where the first electromagnet and the second electromagnet contact each other.

Each of the plurality of electromagnets may include a body portion, and an edge portion positioned at each of opposite sides of the body portion, wherein the edge portion of the first electromagnet and a lateral surface of the edge portion of the second electromagnet may contact each other.

A shape of the edge portion may be different from that of the body portion.

The body portion and the edge portion may be formed to have a polyhedral shape.

The edge portion may be formed to have a hexahedral shape.

The edge portion may be formed to have a frustum of quadrangular pyramid shape including a bottom surface, a top surface, and four lateral surfaces.

A top surface of the edge portion of the first electromagnet and a top surface of a lateral surface of the edge portion of the second electromagnet may be in contact with each other, or a lateral surface of the edge portion of the first electromagnet and a lateral surface of the edge portion of the second electromagnet may be in contact with each other.

An angle formed by a body portion of the first electromagnet and a body portion of the second electromagnet when the top surface of the edge portion of the first electromagnet and the top surface of the edge portion of the second electromagnet are in contact with each other may be different from an angle formed by the body portion of the first electromagnet and the body portion of the second electromagnet when a lateral surface of the edge portion of the first electromagnet and a lateral surface of the edge portion of the second electromagnet are in contact with each other.

The body portion may be formed to have a quadrangular pillar shape.

The display device may further include a power supply unit that applies a current to the flexibility adjuster.

The power supply unit may apply a current to some of the plurality of electromagnets.

The display panel may have a quadrangular planar shape that includes two long sides and two short sides, and the power supply unit may apply a current to electromagnets positioned on the two short sides of the display panel, or to electromagnets positioned on the two long sides of the display panel.

The power supply unit may control an amount of the current applied to the flexibility adjuster.

The display panel may be bendable or foldable.

An embodiment may be related to a controlling method of a display device. The method may include the following steps: reducing or blocking a current applied to a plurality of electromagnets positioned on an edge of a display panel, and bending or unfolding the display panel; and applying or increasing a current to the plurality of electromagnets, wherein the plurality of electromagnets may include a first electromagnet and a second electromagnet contacting each other, and an angle formed by the first electromagnet and the second electromagnet may vary according to a position where the first electromagnet and the second electromagnet contact each other.

The bending or unfolding of the display panel may include decreasing or blocking a current applied to all of the plurality of electromagnets.

The bending or unfolding of the display panel may include decreasing or blocking a current applied to some of the plurality of electromagnets.

The display panel may have a quadrangular planar shape that includes two long sides and two short sides, and the bending or unfolding of the display panel may include decreasing or blocking a current applied to electromagnets positioned on the two long sides of the display panel.

The display panel may have a quadrangular planar shape that includes two long sides and two short sides, and the bending or unfolding of the display panel may include decreasing or blocking a current applied to electromagnets positioned on the two short sides of the display panel.

Each of the plurality of electromagnets may include a body portion, and an edge portion positioned at each of opposite sides of the body portion, wherein the edge portion of the first electromagnet and the edge portion of the second electromagnet may contact each other.

A shape of the edge portion may be different from that of the body portion.

The body portion may be formed to have a quadrangular pillar shape, and the edge portion may be formed to have a frustum of quadrangular pyramid shape including a bottom surface, a top surface, and four lateral surfaces.

A top surface of the edge portion of the first electromagnet and a top surface of the edge portion of the second electromagnet may be in contact with each other, or a lateral surface of the edge portion of the first electromagnet and a lateral surface of the edge portion of the second electromagnet may be in contact with each other.

An angle formed by a body portion of the first electromagnet and a body portion of the second electromagnet when the top surface of the edge portion of the first electromagnet and the top surface of the edge portion of the second electromagnet are in contact with each other may be different from an angle formed by the body portion of the first electromagnet and the body portion of the second electromagnet when a lateral surface of the edge portion of the first electromagnet and a lateral surface of the edge portion of the second electromagnet are in contact with each other.

An embodiment may be related to a display device. The display device may include a display panel, and first contact member, and a second contact member. The display panel may have a first edge, which may include a first section and a second section. The first contact member may be or may include a first electromagnet. The first contact member may extend parallel to the first section and may have a first side, a second side, and a third side. The first side may be oriented a first obtuse angle with respect to the second side and may be connected through the second side to the third side. The second contact member may be or may include a second electromagnet. The second contact member may directly contact the first contact member, may extend parallel to the second section, and may have a fourth side, a fifth side, and a sixth side. The fourth side may be oriented a second obtuse angle with respect to the fifth side and may be connected through the fifth side to the sixth side. The first contact member may be connected through the second contact member to the second section. The second contact member may be connected through the first contact member to the first section.

The display device may have a first configuration and a second configuration. The first side may directly contact the fourth side in the first configuration. The second side may directly contact the fifth side in the second configuration, The first side may exert an attractive magnetic force on the fourth side in the first configuration.

The second side may exert an attractive magnetic force on the fifth side in the second configuration.

The first section may be oriented at a first-configuration angle with respect to the second section in the first configuration. The first section may be oriented at a second-configuration angle with respect to the second section in the second configuration. The first-configuration angle may be unequal to the second-configuration angle.

The third side may extend parallel to at least one of the first section and a tangent of the first section in each of the first configuration and the second configuration. The sixth side may extend parallel to at least one of the second section and a tangent of the second section in both the first configuration and the second configuration.

Each of the third side and the sixth side may extend parallel to each of the first section and the second section in the first configuration. Both the third side and the sixth side may be positioned between the first section and the second section in the second configuration.

The first side may be perpendicular to at least one of the first section and a tangent of the first section in each of the first configuration and the second configuration. The fourth side may be perpendicular to at least one of the second section and a tangent of the second section in both the first configuration and the second configuration.

The first side may be perpendicular to the third side. The fourth side may be perpendicular to the sixth side.

The first side may share a first common edge with the second side. The fourth side may share a second common edge with the fifth side.

The first common edge may directly contact and/or may extend parallel to the second common edge in each of the first configuration and the second configuration.

The first contact member may include a seventh side. The seventh side may be connected through the first side to the second side and may be oriented at a third obtuse angle with respect to the first side. The second contact member may include an eighth side. The eighth side may be connected through the fourth side to the fifth side and may be oriented at a fourth obtuse angle with respect to the fourth side. The display device may have a third configuration. The seventh side may directly contact the eighth side in the third configuration. The first section may be oriented at a first-configuration angle with respect to the second section in the first configuration. The first section may be oriented at a third-configuration angle with respect to the second section in the third configuration. The first-configuration angle may be unequal to the third-configuration angle. The seventh side may share a third common edge with the first side. The eighth side may share a fourth common edge with the fourth side. The third common edge may directly contact and/or may extend parallel to the fourth common edge in each of the first configuration and the third configuration.

The first obtuse angle may be equal or unequal to the second obtuse angle.

The first contact member may include a seventh side and an eighth side. The seventh side may be opposite the first side, may be oriented at a third obtuse angle with respect to the eighth side, and may be connected through the eighth side to the third side. The third obtuse angle may be unequal to the first obtuse angle.

The display device may include a power supply unit. The power supply unit may be electrically connected to the first contact member and may control magnetic attraction between the first contact member and the second contact member.

The power supply unit may supply an electric current to the first contact member to enable the second side to exert an attractive magnetic force on the fifth side.

The display device may include a third contact member and a fourth contact member. The third contact member may extend not parallel to the first contact member, may extend not aligned with the first contact member, and may be or may include a third electromagnet. The third contact member may extend perpendicular to the first contact member. The fourth contact member may directly contact the third contact member. The display panel may include a second edge. The second edge may include a third section and a fourth section. The third section may extend parallel to the third contact member and may be connected through the third contact member to the fourth contact member. The fourth section may extend parallel to the fourth contact member and may be connected through the fourth contact member to the third contact member.

Control of the third electromagnet (and/or the third contact member) may be independent of control of the first electromagnet (and/or the first contact member).

An embodiment may be related to a method of operating a display device. The method may include the following steps: bending the display device; and after the bending, controlling at least a first contact member to exert an attractive magnetic force on a second contact member.

The display device may include a display panel, the first contact member, and the second contact member. The display panel may include a first edge. The first edge may include a first section and a second section. The first contact member may extend parallel to the first section and may include a first side, a second side, and a third side. The first side may be oriented a first obtuse angle with respect to the second side and may be connected through the second side to the third side. The second contact member may directly contact the first contact member, may extend parallel to the second section, and may include a fourth side, a fifth side, and a sixth side. The fourth side may be oriented a second obtuse angle with respect to the fifth side and may be connected through the fifth side to the sixth side. The first contact member may be connected through the second contact member to the second section. The second contact member may be connected through the first contact member to the first section. The first contact member may be or may include a first electromagnet.

The method may include this step: before the bending, controlling at least the first contact member to stop magnetic attraction between the first contact member and the second contact member.

The method may include this step: before the bending, controlling at least the first contact member to reduce magnetic attraction between the first contact member and the second contact member from a first level to a second level. A magnetic force associated with the second level may be greater than 0 newton.

The method may include the following steps: before the bending, controlling at least the first contact member to reduce a first magnetic attraction; and during the bending, controlling at least a third contact member to maintain a second magnetic attraction. The first magnetic attraction may be between the first contact member and the second contact member. The second magnetic attraction may be between the third contact member and a fourth contact member. The third contact member may extend not parallel to the first contact member, may be or may include a second electromagnet, and may directly contact the fourth contact member. The display panel may include a second edge. The second edge may include a third section and a fourth section. The third section may extend parallel to the third contact member and may be connected through the third contact member to the fourth contact member. The fourth section may extend parallel to the fourth contact member and may be connected through the fourth contact member to the third contact member.

According to embodiments, shapes of a display device may be conveniently changed and/or maintained by controlling at least an electromagnet. Advantageously, portability and/or usability of the display device may be satisfactory.

DETAILED DESCRIPTION

Figure 1:
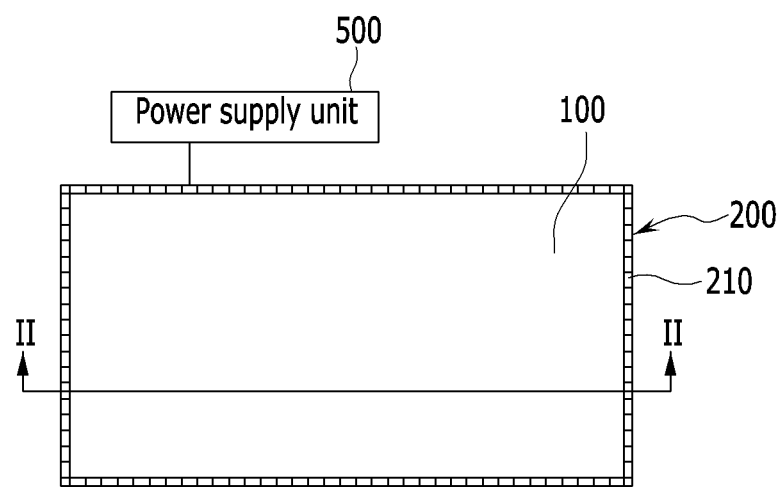
FIG. 1 illustrates a layout view of a display device according to an embodiment.

Embodiments are described with reference to the accompanying drawings. As those skilled in the art would realize, the described embodiments may be modified in various ways.

In this application, although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the drawings, the thickness of layers, films, panels, regions, etc., may be exaggerated for clarity. Like reference numerals may designate like elements. In this application, when a first element (such as a layer, film, region, or substrate) is referred to as being "on" a second element, the first element can be directly on the second element, or one or more intervening elements may also be present. In contrast, when a first element is referred to as being "directly on" a second element, there are no intended intervening elements (except for environmental elements such as air) present between the first element and the second element.

In this application, some or all contact members may be or may include electromagnets, and the term "contact member" and the term "electromagnet" may be used interchangeably.

Figure 2:
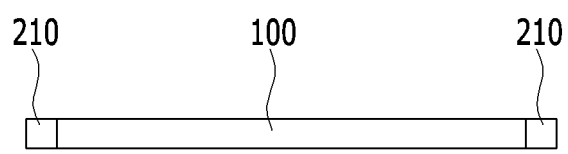
FIG. 2 illustrates a cross-sectional view of the display device taken along line II-II of FIG. 1 according to an embodiment.
Figure 3:
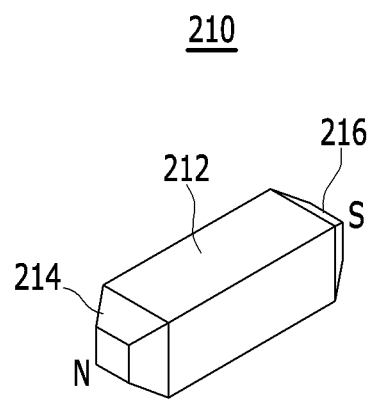
FIG. 3 illustrates a perspective view of a contact member (or an electromagnet) of the display device according to an embodiment.

FIG. 1 illustrates a layout view of a display device according to an embodiment, FIG. 2 illustrates a cross-sectional view of the display device taken along line II-II of FIG. 1 according to an embodiment, and FIG. 3 illustrates a perspective view of a contact member (or an electromagnet) of the display device according to an embodiment.

Referring to FIG. 1 and FIG. 2, a display device according to an embodiment includes a display panel 100 and a flexibility adjuster 200 positioned at an edge of the display panel 100.

The display panel 100 may be formed of a liquid crystal display panel, an organic light emitting diode display panel, or the like. The liquid crystal display panel may have a structure in which a liquid crystal layer is disposed between two substrates provided with a field generating electrode such as a pixel electrode or a common electrode. In addition, the liquid crystal display panel may be formed as a single substrate. In this case, the liquid crystal display panel may have a structure in which the single substrate is provided with a plurality of microcavities, a liquid crystal layer is disposed in the plurality of microcavities, and the plurality of microcavities are sealed by an overcoat. The organic light emitting diode device may include two electrodes and an organic emission layer disposed between the two electrodes.

The display panel 100 may be made of a bendable or foldable material. For example, the display panel 100 may include a substrate made of glass, plastic, or the like.

The display panel 100 may be made of a material having a good (i.e., high) or bad (i.e., low) flexibility. When the display panel 100 is made of a material with a good flexibility like a thin paper, a user can bend it well in a desired shape. However, when the display panel 100 is made of the material with the good flexibility, it may be easily modified, but it is not well-maintained in the shape desired by the user. This is because the display panel 100 is easily changed to other shapes when a weak external force is applied thereto. When the display panel 100 is made of a material with the bad flexibility such as glass, the user cannot bend it well in the desired shape. The material with the bad flexibility is not easily modified, and even if it is modified, it is not easily maintained in the shape desired by the user. This is because the display panel 100 has a strong restoring force to its original state.

The flexibility adjuster 200 is included in the embodiment includes, thus the display panel 100 may be maintained in the desired shape by properly adjusting the flexibility. The flexibility adjuster 200 includes a plurality of electromagnets 210 positioned on an edge of the display panel 100. The electromagnets 210 may be contact members or may be included in contact members that directly contact one or more other contact members along an edge of the display panel 100. Structures of contact members with electromagnets may be identical to, analogous to, or different from structures of contact members without electromagnets.

The electromagnets 210 are magnetized when a current flows and return to their original states when no current flows, therefore they are different from a permanent magnet that always maintains a magnetic state regardless of supply of a current. When a current flows in a wire, a concentric magnetic field is formed around the wire. By using such a principle, a very strong magnetic field which the permanent magnet cannot provide may be obtained. When magnetization of an iron core of the electromagnet 210 progresses to a certain extent, that is, to a magnetic saturation state, the magnetization does not progress even if more current is supplied. An intensity of a magnetic field of the electromagnet 210 may be changed by adjusting the current. Accordingly, the electromagnet is used in a wide range from a relay of a communication device to 1 ton or more electromagnetic crane. The simplest electromagnet 210 may be made by winding a coil on an iron core of a cylindrical shape. When a current flows in the coil wound on the iron core of a cylindrical shape, a magnetic field is generated, and when another iron core is inserted in the iron core of a cylindrical shape, a stronger magnetic field may be generated.

The display panel 100 may have a quadrangular planar shape having two long sides and two short sides. A plurality of electromagnets 210 may be disposed on all edges of the display panel 100 along the two long sides and the two short sides of the display panel 100. The plurality of electromagnets 210 may be disposed to contact each other. In addition, each electromagnet 210 contacts the display panel 100.

The planar shape of the display panel 100 is not limited to a quadrangle, but it may be variously modified. For example, the display panel 100 may be formed in a polygonal shape such as a triangle and a pentagon, a circular shape, and an oval shape. The plurality of electromagnets 210 may contact each other along the edges of such a display panel 100.

In FIG. 1, all the electromagnets 210 are disposed to contact each other, but the present invention is not limited thereto. In some region, the electromagnets 210 may be disposed to be spaced apart from each other. In addition, the electromagnets 210 are disposed on some of the edges of the display panel 100, and the electromagnet 210 may not be disposed on other edges thereof. For example, the electromagnets 210 are disposed on the two long sides of the display panel 100, and the electromagnet 210 may not be disposed on the two short sides thereof. Further, the electromagnets 210 are disposed on the two short sides of the display panel 100, and the electromagnets 210 may not be disposed on the two long sides thereof.

As described above, the electromagnets 210 are disposed to contact each other, but a predetermined space may be provided between the electromagnets 210. In a state in which a current is not applied to the electromagnets 210, although the plurality of electromagnets 210 do not contact each other, when a current is applied to the electromagnets 210, a magnetic force is generated between the plurality of electromagnets 210 to contact each other.

When a current is applied to each of the electromagnets 210, opposite edges thereof represent the N and S polarities, respectively. In this case, it is preferable to dispose the plurality of electromagnets 210 so that the N and S polarity edges thereof contact each other. This is because repulsive force is generated between adjacent electromagnets 210 when edges of the same polarity contact each other.

The display device according to the embodiment may include a power supply unit 500 supplying a current to the flexibility adjuster 200. The power supply unit 500 may supply the current to the plurality of electromagnets 210 that form the flexibility adjuster 200. When the power supply unit 500 supplies the current the electromagnets 210, the electromagnets 210 are magnetized. When the power supply unit 500 is turned off such that the current is not supplied to the electromagnets 210, the electromagnets 210 return to their original non-magnetized state. In addition, when the power supply unit 500 supplies a larger amount of current to the electromagnets 210, a magnetic field of the electromagnets 210 becomes stronger. In contrast, when the power supply unit 500 supplies a smaller amount of current to the electromagnets 210, the magnetic field of the electromagnets 210 becomes weaker. That is, the power supply unit 500 may determine whether to supply the current to the electromagnets 210, and may control an amount of the current supplied to the electromagnet 210.

The power supply unit 500 may supply the current to all of the electromagnets 210, or may supply the current to some of the electromagnets 210. For example, the current may be supplied to electromagnets 210 positioned on the two short sides of the display panel 100, but may not be supplied to electromagnets 210 positioned on the two long sides thereof. Alternatively, the current may be supplied to electromagnets 210 positioned on the two long sides of the display panel 100, but may not be supplied to electromagnets 210 positioned on the two short sides thereof.

The power supply unit 500 may be positioned outside of the display panel 100, or may be positioned directly on the display panel 100. For example, the power supply unit 500 may be formed as a tape carrier package (TCP), and may be positioned at the outside of the display panel 100 to be connected to the flexibility adjuster 200. Alternatively, the power supply unit 500 may be formed as a chip-on-glass (COG), and may be positioned on the display panel 100 to be connected to the flexibility adjuster 200.

Referring to FIG. 3, each electromagnet 210 of the display device according to the embodiment includes a body portion 212, and edge portions 214 and 216 positioned at opposite sides of the body portion 212.

The body portion 212 may be formed to have a polyhedron shape. The body portion 212 may be formed to have a hexahedron shape, particularly, a cuboid shape. However, the shape of the body portion 212 is not limited thereto, but is modifiable in many ways.

The shape of the edge portions 214 and 216 may be different from that of the body portion 212. The edge portions 214 and 216 may be formed to have a polyhedron shape. The edge portions 214 and 216 may be formed to have a hexahedron shape, particularly, a frustum of quadrangular pyramid shape. The frustum of quadrangular pyramid shape includes a bottom surface, a top surface, and four lateral surfaces. The bottom surface of the frustum of quadrangular pyramid shape contacts the body portion 212. The top surface of the frustum of quadrangular pyramid shape is positioned at an opposite side to the bottom surface thereof. The bottom and top surfaces of the frustum of quadrangular pyramid shape are different from each other, and each of the four lateral surfaces thereof has an inclined form. The edge portions 214 and 216 may include a first edge portion 214 having an N polarity and a second edge portion 216 having an S polarity.

Although not illustrated, an iron core and a coil wound on the iron core may be provided inside of the electromagnet 210. The coil include one end portion having a positive polarity and the other end portion having a negative polarity, and the one end portion having the positive polarity may be positioned at the first edge portion 214, and the other end portion having the negative polarity may be positioned at the second edge portion 216.

Coils of the plurality of electromagnets 210 may be independently connected to the power supply unit 500, respectively. In this case, the power supply unit 500 may independently supply a current to each of the electromagnets 210. Accordingly, whether to supply the current to each electromagnet 210 and an amount of the current may be independently determined or controlled.

Alternatively, all coils of the plurality of electromagnets 210 may be connected to each other to be connected together to the power supply unit 500. In this case, the power supply unit 500 may independently supply a current to each of the electromagnets 210. A current may be supplied or blocked to all of the plurality of electromagnets 210, and the amount of the current supplied to the plurality of electromagnets 210 may be adjusted.

Alternatively, some coils of the plurality of electromagnets 210 may be connected to each other to be connected together to the power supply unit 500. In this case, the power supply unit 500 may independently supply a current to the electromagnets 210 for each region. Accordingly, whether to supply the current to the electromagnet 210 for each region and an amount of the current may be independently determined or controlled.

The coils of the plurality of electromagnets 210 may be connected in series or in parallel. For example, if a positive polarity end portion of a coil of one electromagnet 210 is connected to a negative polarity end portion of a coil of another electromagnet 210, they may be connected in series. Alternatively, if a positive polarity end portion of a coil of one electromagnet 210 and a positive polarity end portion of a coil of another electromagnet 210 are connected to each other, and a negative polarity end portion of the coil of the one electromagnet 210 and a negative polarity end portion of the coil of the another electromagnet 210 are connected to each other, they may be connected in parallel.

Hereinafter, in the display device according to an embodiment, positions of the electromagnets contacting each other will be described with reference to FIG. 4 and FIG. 5.

Figure 4:
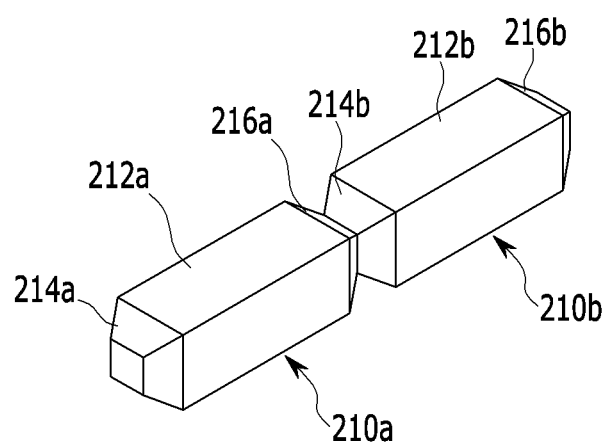
FIG. 4 and FIG. 5 illustrate a perspective view of two adjacent contact members (or two adjacent electromagnets) of the display device according to an embodiment, respectively.
Figure 5:
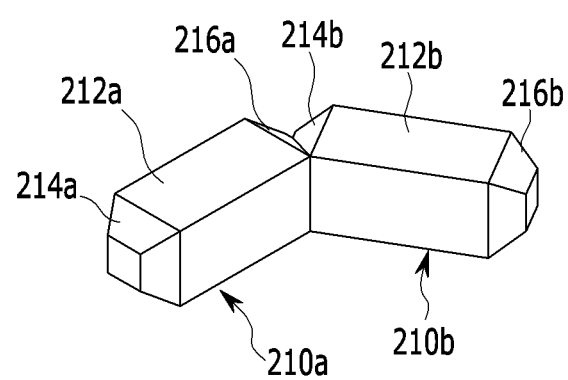

FIG. 4 and FIG. 5 illustrate a perspective view of two contact members (or two electromagnets) contacting each other in the display device according to an embodiment, respectively.

The flexibility adjuster 200 of the display device according to the embodiment includes the plurality of electromagnets 210, and the plurality of electromagnets 210 includes a first electromagnet 210*a* and a second electromagnet 210*b*.

The electromagnets 210*a* and 210*b* include body portions 212*a* and 212*b*, and first edge portions 214*a* and 214*b* and second edge portions 216*a* and 216*b* that are positioned at opposite sides of the body portions 212*a* and 212*b*, respectively. The first edge portions 214*a* and 214*b* may have an N polarity, and the second edge portions 216*a* and 216*b* may have an S polarity. The first edge portions 214*a* and 214*b* and the second edge portions 216*a* and 216*b* may be formed to have a frustum of quadrangular pyramid shape including a bottom surface, a top surface, and four lateral surfaces. The bottoms of the first edge portions 214*a* and 214*b*, and the bottoms of the second edge portions 216*a* and 216*b*, contact the body portions 212*a* and 212*b*, respectively.

The first electromagnet 210*a* and the second electromagnet 210*b* contact each other. In this case, a second edge portion 216*a* of the first electromagnet 210*a* and a first edge portion 214*b* of the second electromagnet 210*b* contact each other. That is, the S polarity of the first electromagnet 210*a* may contact the N polarity of the second electromagnet 210*b*.

Referring to FIG. 4, a top surface of the second edge portion 216*a* of the first electromagnet 210*a* and a top surface of the first edge portion 214*b* of the second electromagnet 210*b* contact each other. The body portion 212*a* of the first electromagnet 210*a* and the body portion 212*b* of the second electromagnet 210*b* form an angle of about 180°.

Referring to FIG. 5, a lateral surface of the second edge portion 216*a* of the first electromagnet 210*a* and a lateral surface of the first edge portion 214*b* of the second electromagnet 210*b* contact each other. The body portion 212*a* of the first electromagnet 210*a* and the body portion 212*b* of the second electromagnet 210*b* form an angle in a range that is equal to or greater than about 90° to less than about 180°.

The angle formed by the body portion 212*a* of the first electromagnet 210*a* and the body portion 212*b* of the second electromagnet 210*b* when the top surface of the second edge portion 216*a* of the first electromagnet 210*a* and the top surface of the first edge portion 214*b* of the second electromagnet 210*b* contact each other is different from the angle formed by the body portion 212a of the first electromagnet 210a and the body portion 212b of the second electromagnet 210b when the lateral surface of the second edge portion 216a of the first electromagnet 210a and the lateral surface of the first edge portion 214b of the second electromagnet 210b contact each other. The angle formed by the body portion 212a of the first electromagnet 210a and the body portion 212b of the second electromagnet 210b when the top surface of the second edge portion 216a of the first electromagnet 210a and the top surface of the first edge portion 214b of the second electromagnet 210b contact each other is greater than the angle formed by the body portion 212a of the first electromagnet 210a and the body portion 212b of the second electromagnet 210b when the lateral surface of the second edge portion 216a of the first electromagnet 210a and the lateral surface of the first edge portion 214b of the second electromagnet 210b contact each other. That is, the angle formed by the first electromagnet 210a and the second electromagnet 210b varies according to a position at which the first electromagnet 210a and the second electromagnet 210b contact each other.

Figure 6:
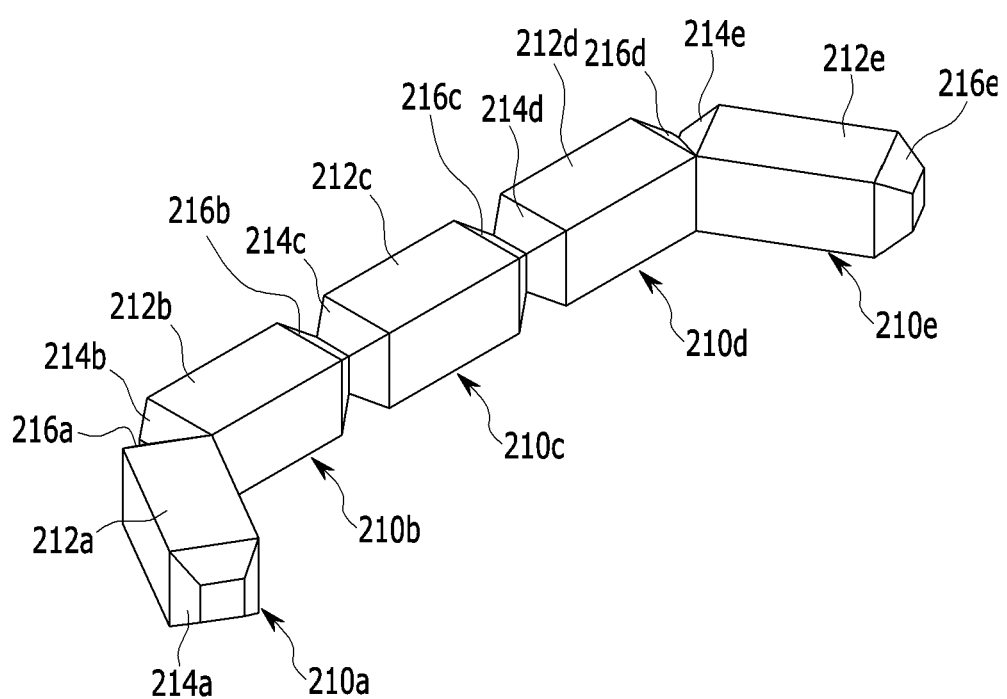
FIG. 6, FIG. 8, and FIG. 10 illustrate perspective views of a plurality of contact members (or a plurality of electromagnets) of the display device according to one or more embodiments.
Figure 7:
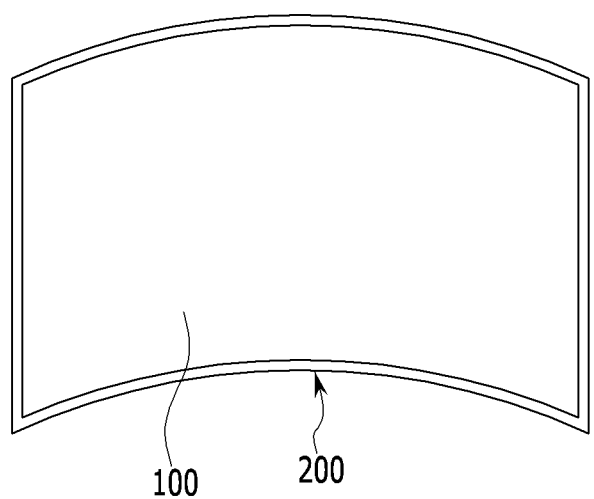
FIG. 7, FIG. 9, and FIG. 11 illustrate various display devices or various configurations of a display device according to one or more embodiments.
Figure 8:
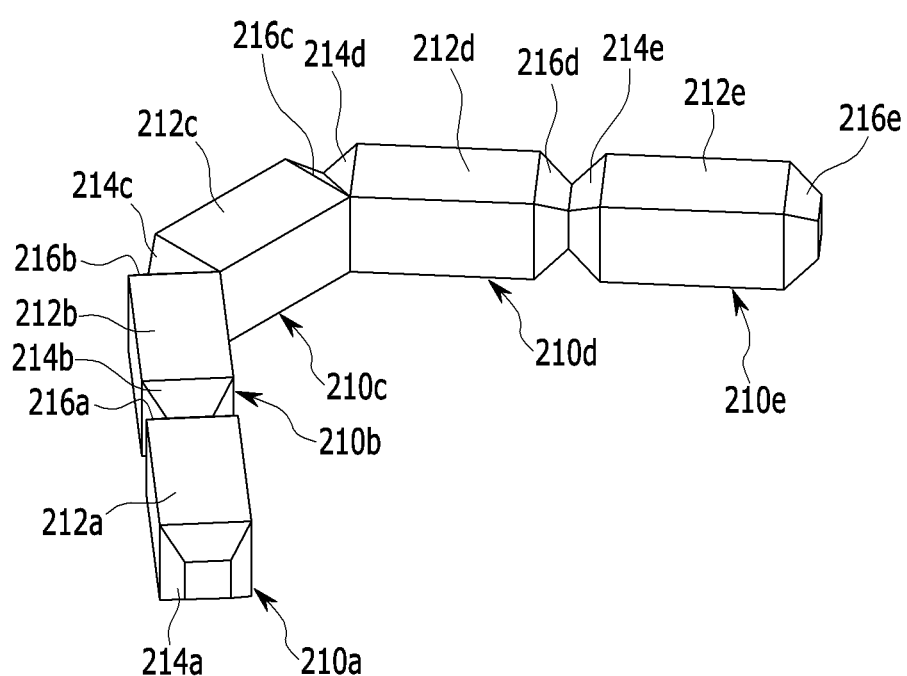
Figure 9:
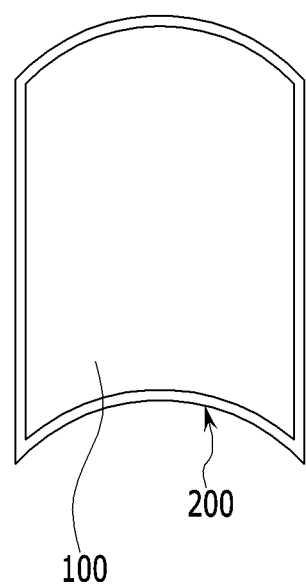
Figure 10:
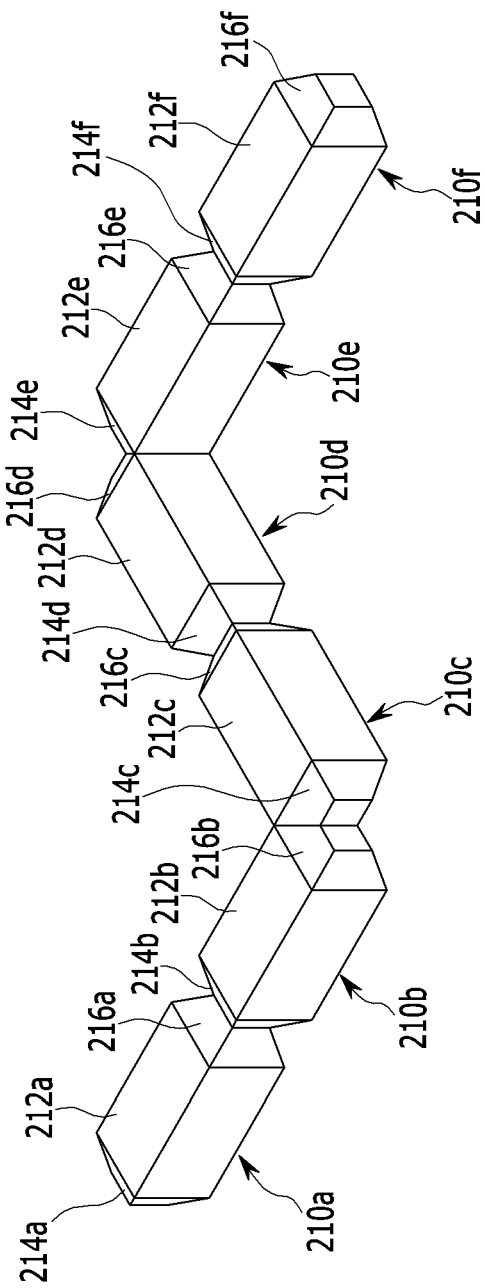
Figure 11:
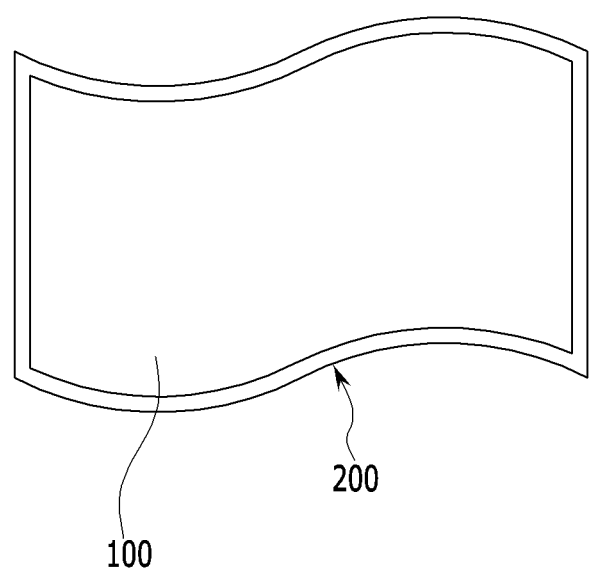

FIG. 6, FIG. 8, and FIG. 10 illustrate perspective views of a plurality of contact members (or a plurality of electromagnets) of a display device according to one or more embodiments. FIG. 7, FIG. 9, and FIG. 11 illustrate various display devices or various configurations of a display device according to one or more embodiments.

Referring to FIG. 6 and FIG. 7, five electromagnets 210 may include a first electromagnet 210a, a second electromagnet 210b, a third electromagnet 210c, a fourth electromagnet 210d, and a fifth electromagnet 210e. The lateral surface of the second edge portion 216a of the first electromagnet 210a and the lateral surface of the first edge portion 214b of the second electromagnet 210b may contact each other. In this case, the first electromagnet 210a and the second electromagnet 210b form an angle of less than about 180°. A top surface of a second edge portion 216b of the second electromagnet 210b and a top surface of a first edge portion 214c of the third electromagnet 210c may contact each other. In this case, the second electromagnet 210b and the third electromagnet 210c form an angle of about 180°. A top surface of a second edge portion 216c of the third electromagnet 210c and a top surface of a first edge portion 214d of the fourth electromagnet 210d may contact each other. In this case, the third electromagnet 210c and fourth electromagnet 210d form an angle of about 180°. A lateral surface of a second edge portion 216d of the fourth electromagnet 210d and a lateral surface of a first edge portion 214e of the fifth electromagnet 210e may contact each other. In this case, the fourth electromagnet 210d and the fifth electromagnet 210e form an angle of less than about 180°. In such a case, the display panel 100 may have a relatively great curvature radius.

Referring to FIG. 8 and FIG. 9, the five electromagnets 210 may include the first electromagnet 210a, the second electromagnet 210b, the third electromagnet 210c, the fourth electromagnet 210d, and the fifth electromagnet 210e. A top surface of the second edge portion 216a of the first electromagnet 210a and a top surface of the first edge portion 214b of the second electromagnet 210b may contact each other. In this case, the first electromagnet 210a and the second electromagnet 210b form an angle of about 180°. A lateral surface of the second edge portion 216b of the second electromagnet 210b and a lateral surface of the first edge portion 214c of the third electromagnet 210c may contact each other. In this case, the second electromagnet 210b and the third electromagnet 210c form an angle of less than about 180°. A lateral surface of the second edge portion 216c of the third electromagnet 210c and a lateral surface of the first edge portion 214d of the fourth electromagnet 210d may contact each other. In this case, the third electromagnet 210c and the fourth electromagnet 210d form an angle of less than about 180°. A top surface of the second edge portion 216d of the fourth electromagnet 210d and a top surface of the first edge portion 214e of the fifth electromagnet 210e may contact each other. In this case, the fourth electromagnet 210d and the fifth electromagnet 210e form an angle of about 180°. In such a case, the display panel 100 may have a relatively great curvature radius.

Referring to FIG. 10 and FIG. 11, six electromagnets 210 may include the first electromagnet 210a, the second electromagnet 210b, the third electromagnet 210c, the fourth electromagnet 210d, the fifth electromagnet 210e, and a sixth electromagnet 210f The top surface of the second edge portion 216a of the first electromagnet 210a and the top surface of the first edge portion 214b of the second electromagnet 210b may contact each other. In this case, the first electromagnet 210a and the second electromagnet 210b form an angle of about 180°. The lateral surface of the second edge portion 216b of the second electromagnet 210b and the lateral surface of the first edge portion 214c of the third electromagnet 210c may contact each other. In this case, the second electromagnet 210b and the third electromagnet 210c form an angle of less than about 180°. The top surface of the second edge portion 216c of the third electromagnet 210c and the top surface of the first edge portion 214d of the fourth electromagnet 210d may contact each other. In this case, the third electromagnet 210c and the fourth electromagnet 210d form an angle of about 180°. The lateral surface of the second edge portion 216d of the fourth electromagnet 210d and the lateral surface of the first edge portion 214e of the fifth electromagnet 210e may contact each other. In this case, the fourth electromagnet 210d and the fifth electromagnet 210e form an angle of less than about 180°. A top surface of a second edge portion 216e of the fifth electromagnet 210e and a top surface of a first edge portion 214f of the sixth electromagnet 210f may contact each other. In this case, the fifth electromagnet 210e and the sixth electromagnet 210f form an angle of about 180°. In this case, the second electromagnet 210b and the third electromagnet 210c may contact to have a convex shape in a front direction, and the fourth electromagnet 210d and the fifth electromagnet 210e may contact to have a convex in a rear direction. The six electromagnets 210a, 210b, 210c, 210d, 210e, and 210f may be disposed on an upper edge of the display panel 100. In such a case, a left portion of the display panel 100 may have a convex curvature in the front direction, and a right portion thereof may a convex curvature in the rear direction.

As illustrated in FIG. 6 to FIG. 11, it is possible to variously adjust the curvature of the display panel 100 by properly changing the position at which the electromagnets positioned on the edge of the display panel 100 contact each other.

If the inclined surface is not formed on the edge portion of the electromagnet and the electromagnet is formed to have a wholly cuboid or cylindrical shape, the position at which the electromagnets contact each other is not modifiable, and the electromagnets contacting each other form an angle of about 180°. In the present embodiment, an angle formed by the electromagnets may be changed depending on whether the top or lateral surfaces of the edge portions of the electromagnets contact each other. The top surfaces of the edge portions of some of the plurality of electromagnets may contact each other, and the lateral surfaces of the edge portions of some other of the plurality of electromagnets may contact each other. Accordingly, a shape of the display panel 100 may be variously modified.

In FIG. 6 to FIG. 11, it has been described that five or six electromagnets are disposed at one edge of the display panel 100, but this is merely one example, and the number of the electromagnets disposed at one edge of the display panel 100 may be variously changed. In addition, it has been described that the shape of the display panel 100 is modified according to the position at which the electromagnets positioned on the upper edge of the display panel 100 contact each other, but the shape of the display panel 100 may be variously modified according to positions at which the electromagnets positioned on the remaining edges of the display panel 100 contact each other.

FIG. 12 to FIG. 16 illustrate perspective views of various electromagnets of one or more display devices according to one or more embodiments.

Figure 12:
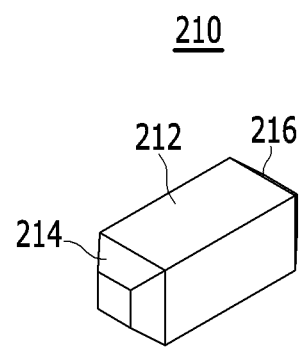
FIG. 12, FIG. 13, FIG. 14, FIG. 15, and FIG. 16 illustrate perspective views of contact members (or electromagnets) of one or more display devices according to one or more embodiments.
Figure 13:
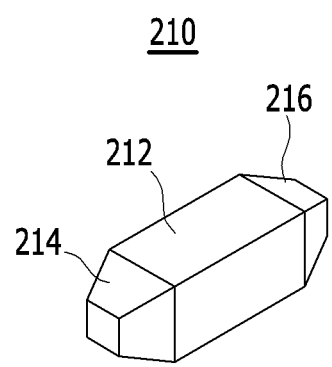

As shown in FIG. 12 and FIG. 13, the edge portions 214 and 216 of the electromagnet 210 may be formed to have a frustum of quadrangular pyramid shape, and a height of the frustum of quadrangular pyramid shape may be variously changed. As shown in FIG. 12, the height of the frustum of quadrangular pyramid shape may be relatively low. As shown in FIG. 13, the height of the frustum of quadrangular pyramid shape may be relatively high. As the height of the frustum of quadrangular pyramid shape becomes higher, when the lateral surfaces of the edge portions 214 and 216 of two electromagnets 210 contact each other, an angle formed by the two electromagnets 210 decreases. Accordingly, when a small curvature radius is required for the display device, the height of the edge portions 214 and 216 of the electromagnet 210 may become high, and when a great curvature radius is required for the display device, the height of the edge portions 214 and 216 of the electromagnet 210 may become low.

Figure 14:
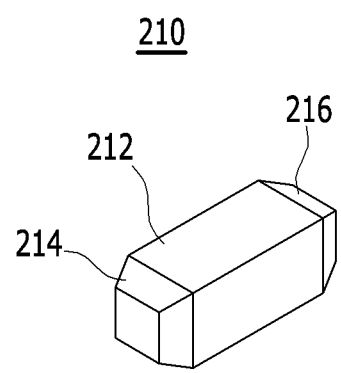
Figure 15:
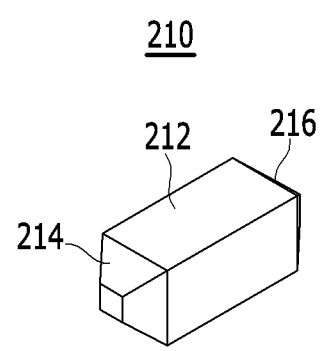

As shown in FIG. 14 and FIG. 15, the edge portions 214 and 216 of the electromagnet 210 may be formed to have a frustum of quadrangular pyramid shape, and areas of the top and lateral surfaces of the frustum of quadrangular pyramid shape may be variously changed. As shown in FIG. 14, the area of the top surface of the frustum of quadrangular pyramid shape may be relatively large. As shown in FIG. 15, the area of the top surface of the frustum of quadrangular pyramid shape may be relatively small. As the area of the top and lateral surfaces of the frustum of quadrangular pyramid shape become larger, when two electromagnets 210 contact each other, a contacting force between them may increase. This is because the contacting area between the two electromagnets 210 becomes larger. Accordingly, in a state in which a current is applied to the electromagnet 210, in order to steadily maintain the shape of the display device, the areas of the top and lateral surfaces of the frustum of quadrangular pyramid shape may become large. In addition, in a state in which a current is applied to the electromagnet 210, in order to weakly maintain the shape of the display device, the areas of the top and lateral surfaces of the frustum of quadrangular pyramid shape may become small.

Figure 16:
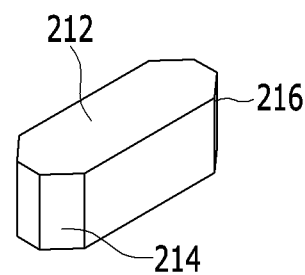

As shown in FIG. 16, the edge portions 214 and 216 of the electromagnet 210 may be formed to have other shapes except the frustum of quadrangular pyramid shape. In this case, the edge portions 214 and 216 of the electromagnet 210 are formed to have a hexahedral shape that includes a bottom surface, a top surface, and four lateral surfaces connecting the bottom surface and the top surface. Two of the four lateral surfaces are perpendicular to the bottom surface and the top surface, and other two lateral surfaces are inclined to the bottom surface and the top surface. When the display device is bent, since the display device is generally bent in both a front direction and a back direction, inclined surfaces may be formed only in an actually bent direction.

FIG. 17 to FIG. 20 are schematic views illustrating a sequence of a controlling method of a display device according to an embodiment. For better understanding and ease of description, the power supply unit is omitted.

Figure 17:
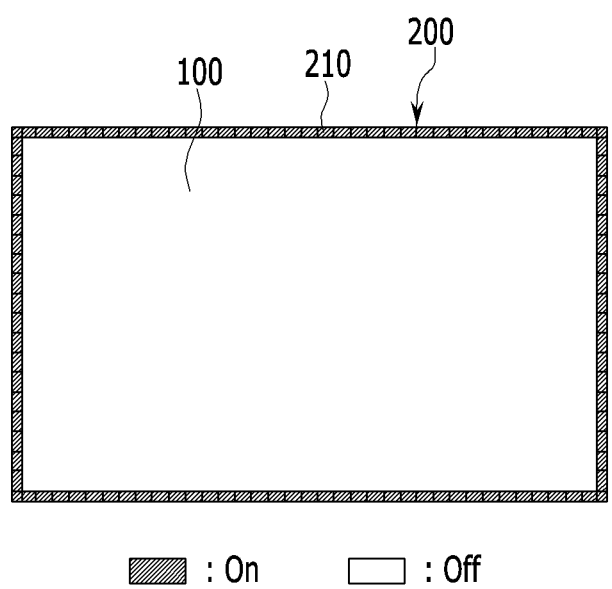
FIG. 17, FIG. 18, FIG. 19, and FIG. 20 are schematic views illustrating a controlling method of the display device according to an embodiment.

As shown in FIG. 17, a current is applied to the plurality of electromagnets 210 positioned the edges of the display panel 100. When the current is applied to the electromagnets 210, the electromagnets 210 are magnetized. Accordingly, the N polarity and the S polarity are formed in the opposite edges of the plurality of electromagnets 210, and an attractive force is generated between the adjacent electromagnets 210. In this case, the adjacent electromagnets 210 are disposed for the N polarity and the S polarity to contact each other. The shape of the display panel 100 is fixed and the flexibility is reduced by a magnetic force between the electromagnets 210. The display panel 100 is maintained in a planar shape, and is not easily bent by an external force.

Figure 18:
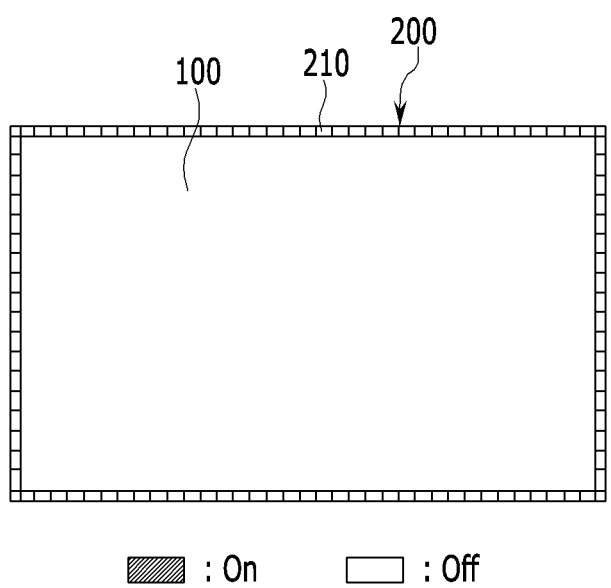

As shown in FIG. 18, the current applied to the plurality of electromagnets 210 is blocked. When the current applied to the electromagnets 210 is blocked, the electromagnets 210 return to their original states which are not magnetized. In this case, the electromagnets 210 do not have the N polarity and the S polarity, and there is no attractive force between the adjacent electromagnets 210. Since the display panel 100 is formed of a bendable or foldable material and there is no magnetic force between the electromagnets 210, the flexibility of the display device may increase.

Figure 19:
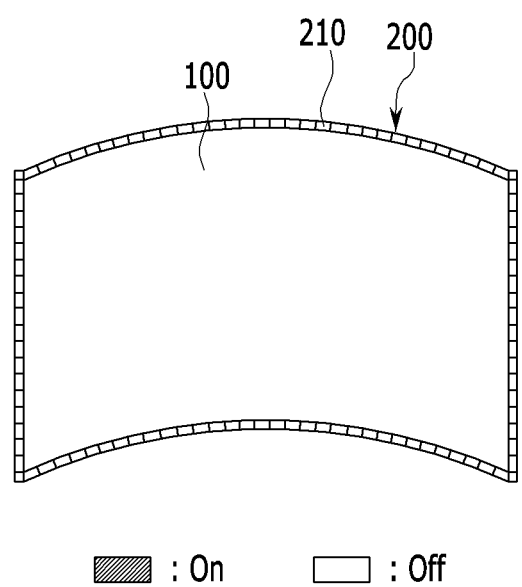
Figure 20:
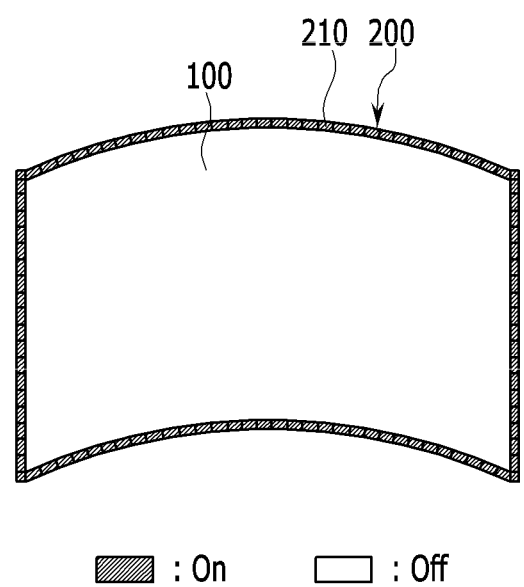

As shown in FIG. 19, in the state in which the current applied to the plurality of electromagnets 210, the display panel 100 is bent. Since the flexibility of the display device increases, the display panel 100 may be easily modified. Since an angle formed by the electromagnets 210 contacting each other is changed depending on a position at which the plurality of electromagnets 210 contact each other, the shape of the display panel 100 may be variously modified.

As shown in FIG. 20, the current is again applied to the plurality of electromagnets 210. When the current is applied to the electromagnets 210, the electromagnets 210 are magnetized, thus the shape of the display panel 100 is fixed by the magnetic force between the electromagnets 210. That is, the flexibility of the display device is reduced again. The display panel 100 maintains a curved shape, and is not easily bent by an external force. When the flexibility of the display panel 100 is strong, it is difficult to fix the display panel 100 in one shape. In the present embodiment, the display panel 100 may be fixed in a predetermined shape by the magnetic force generated by the plurality of electromagnets 210 positioned on the edges of the display panel 100. When the flexibility of the display panel 100 is weak, although the display panel 100 is bent, since a restoring force restoring to its original state is strong, it is difficult to fix the display panel 100 in a bent state. In the present embodiment, the display panel 100 may be fixed in a bent state by the magnetic force generated by the plurality of electromagnets 210 positioned on the edges of the display panel 100.

In summary, after the display panel 100 is modified in the state of increasing the flexibility of the display device by blocking the current applied to the plurality of electromagnets 210, the current is applied to the plurality of electromagnets 210 so that the flexibility of the display device decreases, thereby fixing the shape of the display panel 100.

The flexibility of the display device may be controlled according to whether the current is applied to the plurality of electromagnets 210.

It has been described that the display panel 100 of the planer state is bent to be modified to the curved state, but the present invention is not limited thereto. A process of unfolding the display panel 100 of the curved state to be modified to the planer state may be performed in the same way. After blocking the current applied to the plurality of electromagnets 210 positioned on the edges of the display panel 100 of the curved state and then modifying the display panel 100 to have the planar shape, the current may be again applied to the plurality of electromagnets 210.

A modification of the shape of the display panel 100 may be variously performed. The display panel 100 may be adjusted to have a great or small curvature radius, may have two or more curvature radiuses, and may be circularly rolled.

FIG. 21 to FIG. 24 are schematic views illustrating a sequence of a controlling method of a display device according to an embodiment.

Figure 21:
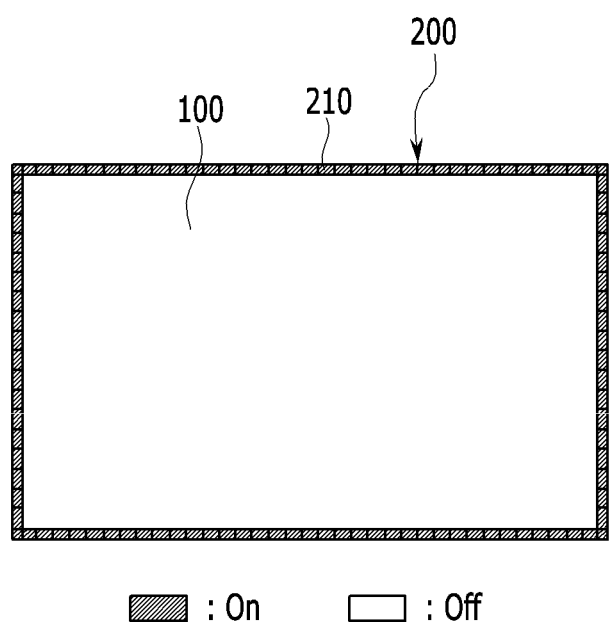
FIG. 21, FIG. 22, FIG. 23, and FIG. 24 are schematic views illustrating a controlling method of the display device according to an embodiment.

As shown in FIG. 21, a current is applied to the plurality of electromagnets 210 positioned on the edges of the display panel 100. When the current is applied to the electromagnets 210, the electromagnets 210 are magnetized. By the magnetic force acting between the electromagnets 210, the shape of the display panel 100 is fixed, and the flexibility of the display device is weakened. The display panel 100 maintains a planer shape, and is not easily bent by an external force.

Figure 22:
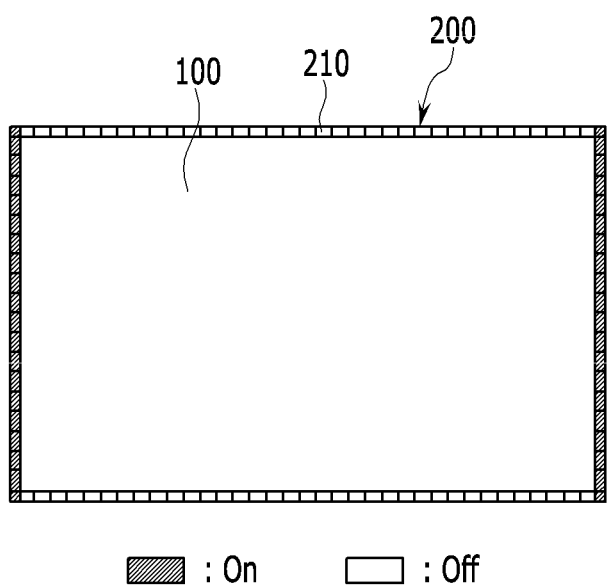

As shown in FIG. 22, a current applied to a plurality of electromagnets 210 positioned on some edges of the display panel 100 is blocked. In the embodiment described above, the current applied to all of the plurality of electromagnets 210 is blocked, but in the present embodiment, the current applied to some of the plurality of electromagnets 210 is blocked. The display panel 100 may have a quadrangular planar shape including two long sides and two short sides. In this case, a current applied to the electromagnets 210 positioned on the two long sides of the display panel 100 may be blocked. A current applied to the electromagnets 210 positioned on the two short sides of the display panel 100 is maintained.

The electromagnets 210 positioned on the two long sides return to their original states which are magnetized. The magnetic force acting between the electromagnets 210 positioned on the two long sides disappears, and the flexibility of the display device is increased at least along a long side direction. The display device is still maintained in a state fixed in a short side direction.

Figure 23:
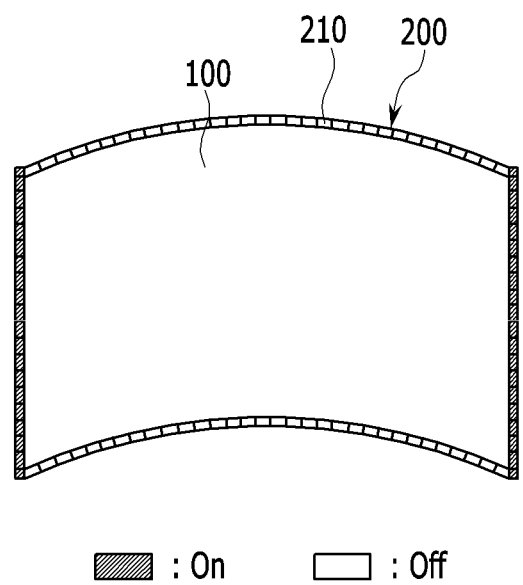
Figure 24:
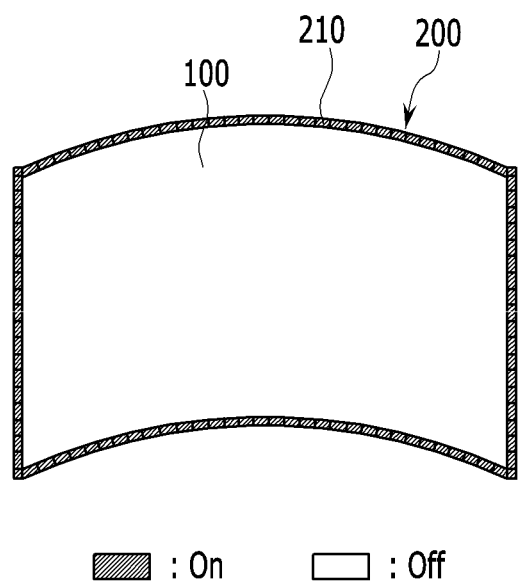

As shown in FIG. 23, in the state in which the current applied to the electromagnets 210 positioned on the two long sides is blocked, the display panel 100 is bent. Since the flexibility of the display device increases along the long side direction, the display panel 100 may be easily modified along the long side direction. An angle formed by the electromagnets 210 contacting each other varies according to a position at which the plurality of electromagnets 210 contact each other, thus a shape of the display panel 100 may be variously modified through such a configuration.

As shown in FIG. 24, the current is again applied to the electromagnets 210 positioned on the two long sides. That is, the current is applied to all of the plurality of electromagnets 210. The electromagnets 210 are magnetized, and the shape of the display panel 100 is fixed by the magnetic force acting between the electromagnets 210. That is, the flexibility of the display device is reduced again. The display panel 100 maintains a curved shape, and is not easily bent by an external force.

In the present embodiment, the flexibility of the display device may be partially controlled by blocking only the current applied to some of the plurality of electromagnets 210. When the display device is bent along the long sides, an undesired modification thereof may be prevented by fixing the short sides of the display device.

It has been described that the display panel 100 of the planer state is bent to be modified to the curved state, and a process of unfolding the display panel 100 of the curved state to be modified to the planer state may be performed in the same way.

FIG. 25 to FIG. 28 are schematic views illustrating a sequence of a controlling method of a display device according to an embodiment.

Figure 25:
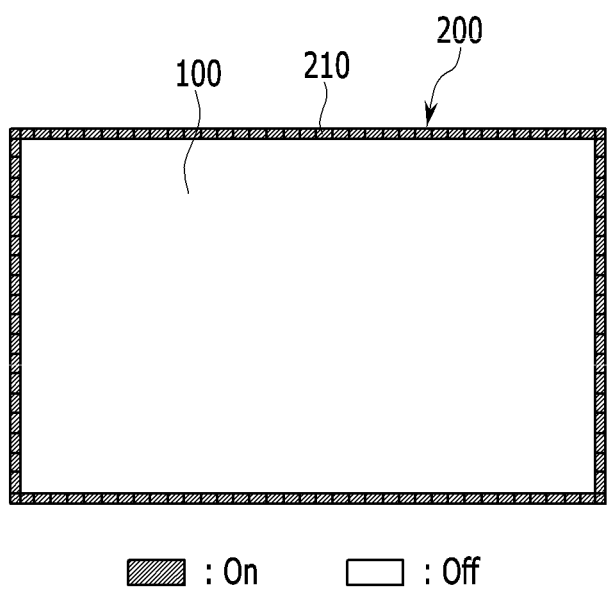
FIG. 25, FIG. 26, FIG. 27, and FIG. 28 are schematic views illustrating a controlling method of the display device according to an embodiment.

As shown in FIG. 25, a current is applied to the plurality of electromagnets 210 positioned on the edges of the display panel 100. When the current is applied to the electromagnets 210, the electromagnets 210 are magnetized. The shape of the display panel 100 is fixed by the magnetic force acting between the plurality of electromagnets 210, and the flexibility of the display device is weakened. The display panel 100 maintains a planer shape, and is not easily bent by an external force.

Figure 26:
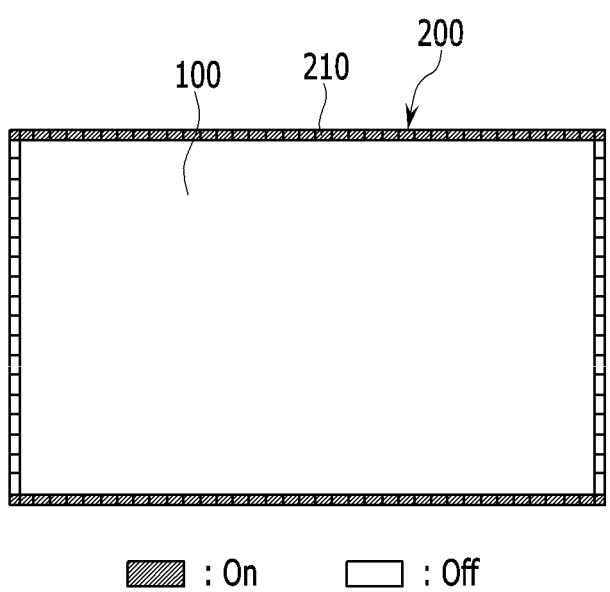

As shown in FIG. 26, a current applied to a plurality of electromagnets 210 positioned on some edges of the display panel 100 is blocked. In the embodiment described above, the current applied to the electromagnets 210 positioned on the two long sides of the display panel 100 is blocked, but in the present embodiment, the current applied to the electromagnets 210 positioned on the two short sides of the display panel 100 is blocked. The current applied to the electromagnets 210 positioned on the two long sides of the display panel 100 is maintained.

The electromagnets 210 positioned on the two short sides return to their original states which are magnetized. The magnetic force acting between the electromagnets 210 positioned on the two short sides disappears, and the flexibility of the display device is increases along the short side direction. The display device is still maintained in a state fixed in the long side direction.

Figure 27:
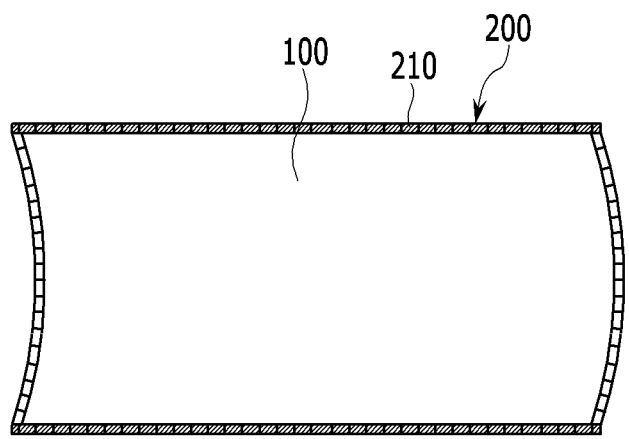
Figure 28:
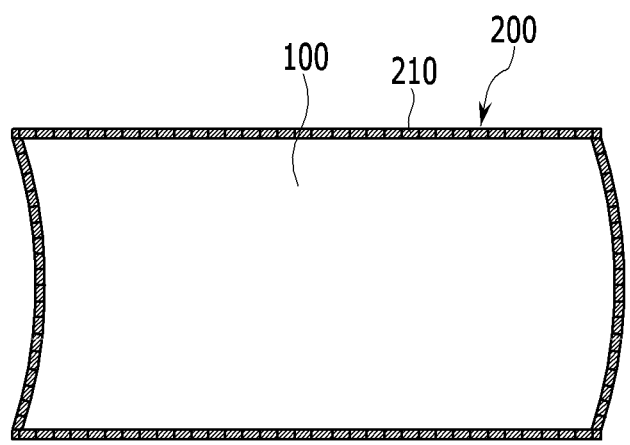

As shown in FIG. 27, in the state in which the current applied to the electromagnets 210 positioned on the two short sides is blocked, the display panel 100 is bent. Since the flexibility of the display device is increases along the short side direction, the display panel 100 may be easily modified along the short side direction. An angle formed by the electromagnets 210 contacting each other varies according to a position at which the plurality of electromagnets 210 contact each other, thus a shape of the display panel 100 may be variously modified through such a configuration.

As shown in FIG. 28, the current is again applied to the electromagnets 210 positioned on the two long sides. That is, the current is applied to all of the plurality of electromagnets 210. The electromagnets 210 are magnetized, and the shape of the display panel 100 is fixed by the magnetic force acting between the electromagnets 210. That is, the flexibility of the display device is reduced again. The display panel 100 maintains a curved shape, and is not easily bent by an external force.

In the present embodiment, the flexibility of the display device may be partially controlled by blocking only the current applied to some of the plurality of electromagnets 210. When the display device is bent along the short sides, an undesired modification thereof may be prevented by fixing the long sides of the display device.

It has been described that the display panel 100 of the planer state is bent to be modified to the curved state, and a process of unfolding the display panel 100 of the curved state to be modified to the planer state may be performed in the same way.

The method of independently controlling the electromagnets 210 positioned on the two long or short sides is described above, but the present invention is not limited thereto. Electromagnets 210 positioned on one long or short side may be independently controlled. Further, electromagnets 210 positioned on a portion of one long or short side may be independently controlled. When only a portion of the display panel 100 is formed to have a curved surface, only electromagnets 210 positioned on a corresponding portion may be independently controlled.

FIG. 29 to FIG. 32 are schematic views illustrating a sequence of a controlling method of the display device according to an embodiment.

Figure 29:
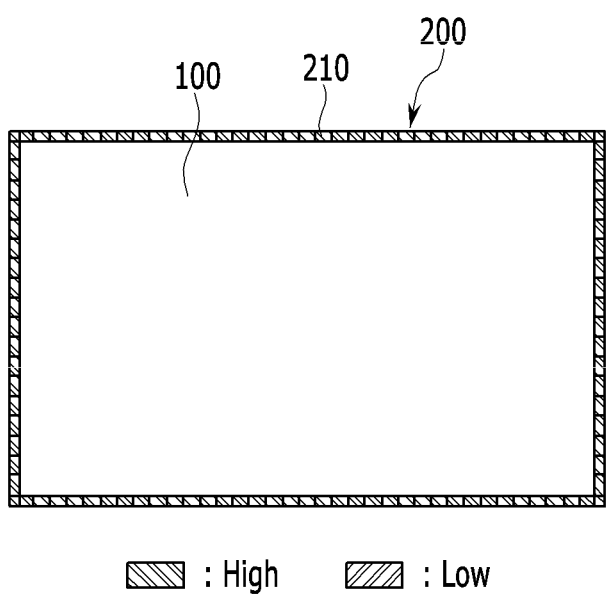
FIG. 29, FIG. 30, FIG. 31, and FIG. 32 are schematic views illustrating a controlling method of the display device according to an embodiment.

As shown in FIG. 29, a high current is applied to the plurality of electromagnets 210 positioned on the edges of the display panel 100. When the high current is applied to the electromagnets 210, the electromagnets 210 are strongly magnetized. The shape of the display panel 100 is fixed by the strong magnetic force acting between the plurality of electromagnets 210, and the flexibility of the display device is weakened. The display panel 100 maintains a planer shape, and is not easily bent by an external force.

Figure 30:
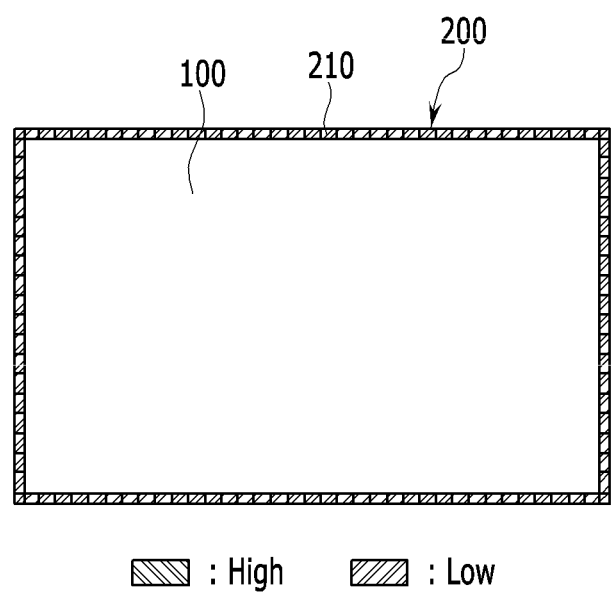

As shown in FIG. 30, the current applied to the plurality of electromagnets 210 is reduced. That is, a low current is applied to the plurality of electromagnets 210. When the current applied to the electromagnets 210 is reduced, an intensity of a magnetic field of the electromagnets 210 decreases. That is, the magnetic field of the electromagnet 210 weakens. As the magnetic force acting between the electromagnets 210 weakens, the flexibility of the display device increases.

Figure 31:
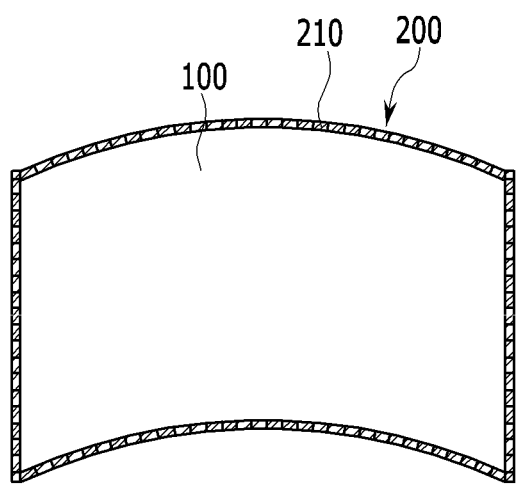

As shown in FIG. 31, in the state in which the low current is applied to the plurality of electromagnets 210, the display panel 100 is bent. Since the flexibility of the display device is increases, the display panel 100 may be easily modified. An angle formed by the electromagnets 210 contacting each other varies according to a position at which the plurality of electromagnets 210 contact each other, thus a shape of the display panel 100 may be variously modified through such a configuration.

Figure 32:
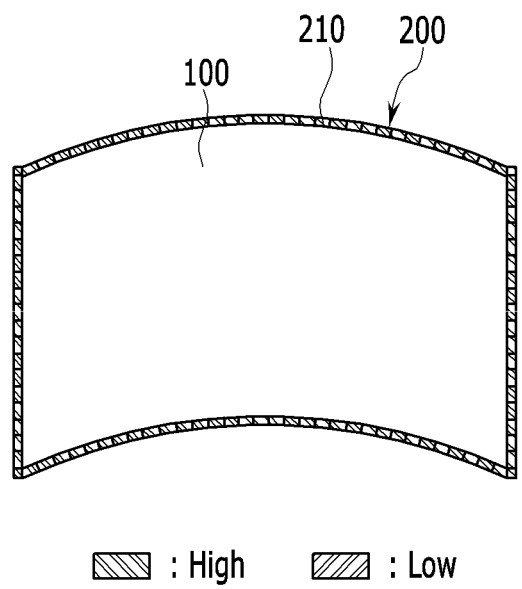

As shown in FIG. 32, the current applied to the plurality of electromagnets 210 is again increased. That is, the high current is applied to the plurality of electromagnets 210. When the current applied to the electromagnets 210 is increased, the intensity of the magnetic field of the electromagnet 210 increases. The shape of the display panel 100 is fixed by the strong magnetic force acting between the plurality of electromagnets 210, and the flexibility of the display device is reduced again. The display panel 100 maintains a curved shape, and is not easily bent by an external force.

In summary, after the display panel 100 is modified in the state of increasing the flexibility of the display device by reducing the current applied to the plurality of electromagnets 210, the current applied to the plurality of electromagnets 210 is increased so that the flexibility of the display device decreases, thereby fixing the shape of the display panel 100. The flexibility of the display device may be controlled by adjusting an amount of the current applied to the plurality of electromagnets 210.

It has been described that the display panel 100 of the planer state is bent to be modified to the curved state, but the present invention is not limited thereto. A process of unfolding the display panel 100 of the curved state to be modified to the planer state may be performed in the same way. After reducing the current applied to the plurality of electromagnets 210 positioned on the edges of the display panel 100 of the curved state and then modifying the display panel 100 to have the planar shape, the current applied to the plurality of electromagnets 210 may be again increased.

A modification of the shape of the display panel 100 may be variously performed. The display panel 100 may be adjusted to have a great or small curvature radius, may have two or more curvature radiuses, and may be circularly rolled.

The method of controlling the shape of the display panel 100 by adjusting an amount of the current applied to all of the plurality of electromagnets 210 is described above, but the present invention is not limited thereto. The shape of the display panel 100 may be controlled by adjusting an amount of the current applied to some of the plurality of electromagnets 210. For example, the shape of the display panel 100 may be modified along the long side direction by adjusting an amount of a current applied to electromagnets 210 positioned on two long sides of the display panel 100. Further, the shape of the display panel 100 may be modified along the short side direction by adjusting an amount of a current applied to electromagnets 210 positioned on two short sides of the display panel 100.

While example embodiments have been described, it is to be understood that possible embodiments are not limited to the described embodiments. Possible embodiments are intended to cover various modifications and equivalent arrangements.

What is claimed is:

1. A display device comprising:
a display panel, which comprises a first edge, wherein the first edge comprises a first section and a second section;
a first contact member, which extends parallel to the first section and comprises a first side, a second side, and a third side, wherein the first side is oriented a first obtuse angle with respect to the second side and is connected through the second side to the third side; and
a second contact member, which directly contacts the first contact member, extends parallel to the second section, and comprises a fourth side, a fifth side, and a sixth side, wherein the fourth side is oriented a second obtuse angle with respect to the fifth side and is connected through the fifth side to the sixth side, wherein the first contact member is connected through the second contact member to the second section, wherein the second contact member is connected through the first contact member to the first section, and wherein the first contact member is or comprises a first electromagnet.

2. The display device of claim 1, wherein the second contact member is or comprises a second electromagnet.

3. The display device of claim 1, wherein the display device has a first configuration and a second configuration, wherein the first side directly contacts the fourth side in the first configuration, and wherein the second side directly contacts the fifth side in the second configuration.

4. The display device of claim 3, wherein the first side is configured to exert an attractive magnetic force on the fourth side in the first configuration.

5. The display device of claim 3, wherein the second side is configured to exert an attractive magnetic force on the fifth side in the second configuration.

6. The display device of claim 3, wherein the first section is oriented at a first-configuration angle with respect to the second section in the first configuration, wherein the first section is oriented at a second-configuration angle with respect to the second section in the second configuration, and wherein the first-configuration angle is unequal to the second-configuration angle.

7. The display device of claim 3, wherein the third side extends parallel to at least one of the first section and a tangent of the first section in each of the first configuration and the second configuration, and wherein the sixth side extends parallel to at least one of the second section and a tangent of the second section in both the first configuration and the second configuration.

8. The display device of claim 3, wherein each of the third side and the sixth side extends parallel to each of the first section and the second section in the first configuration, and wherein both the third side and the sixth side are positioned between the first section and the second section in the second configuration.

9. The display device of claim 3, wherein the first side is perpendicular to at least one of the first section and a tangent of the first section in each of the first configuration and the second configuration, and wherein the fourth side is perpendicular to at least one of the second section and a tangent of the second section in both the first configuration and the second configuration.

10. The display device of claim 3, wherein the first contact member comprises a seventh side, wherein the seventh side is connected through the first side to the second side and is oriented at a third obtuse angle with respect to the first side, wherein the second contact member comprises an eighth side, wherein the eighth side is connected through the fourth side to the fifth side and is oriented at a fourth obtuse angle with respect to the fourth side, wherein the display device has a third configuration, wherein the seventh side directly contacts the eighth side in the third configuration, wherein the first section is oriented at a first-configuration angle with respect to the second section in the first configuration, wherein the first section is oriented at a third-configuration angle with respect to the second section in the third configuration, and wherein the first-configuration angle is unequal to the third-configuration angle.

11. The display device of claim 3, wherein the first obtuse angle is unequal to the second obtuse angle.

12. The display device of claim 1, wherein the first contact member comprises a seventh side and an eighth side, wherein the seventh side is opposite the first side, is oriented at a third obtuse angle with respect to the eighth side, and is connected through the eighth side to the third side, wherein the third obtuse angle is unequal to the first obtuse angle.

13. The display device of claim 1 comprising: a power supply unit, which is electrically connected to the first contact member and is configured to control magnetic attraction between the first contact member and the second contact member.

14. The display device of claim 11, wherein the power supply unit is configured to supply an electric current to the first contact member to enable the second side to exert an attractive magnetic force on the fifth side.

15. The display device of claim 1 comprising:
a third contact member, which extends not parallel to the first contact member and is or comprises a second electromagnet; and
a fourth contact member, which directly contacts the third contact member, wherein the display panel comprises a second edge, wherein the second edge comprises a third section and a fourth section, wherein the third section extends parallel to the third contact member and is connected through the third contact member to the fourth contact member, and wherein the fourth section extends parallel to the fourth contact member and is connected through the fourth contact member to the third contact member.

16. The display device of claim 15, wherein control of the second electromagnet is independent of control of the first electromagnet.

* * * * *